United States Patent
Liang et al.

(10) Patent No.: US 12,315,529 B2
(45) Date of Patent: May 27, 2025

(54) AUDIO COMPENSATION WITH SOUND EFFECT CHARACTERISTIC CURVE TO ADJUST ABNORMAL FREQUENCY POINTS

(71) Applicant: BOE TECHNOLOGY GROUP CO., LTD., Beijing (CN)

(72) Inventors: Jingxian Liang, Beijing (CN); Yan Shen, Beijing (CN); Zhongru Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/795,217

(22) PCT Filed: Sep. 22, 2021

(86) PCT No.: PCT/CN2021/119641
§ 371 (c)(1),
(2) Date: Jul. 25, 2022

(87) PCT Pub. No.: WO2023/044608
PCT Pub. Date: Mar. 30, 2023

(65) Prior Publication Data
US 2024/0212704 A1 Jun. 27, 2024

(51) Int. Cl.
*G10L 21/007* (2013.01)
*G10L 21/034* (2013.01)
(Continued)

(52) U.S. Cl.
CPC ............ *G10L 25/03* (2013.01); *G10L 21/007* (2013.01); *G10L 25/51* (2013.01); *G10L 25/87* (2013.01)

(58) Field of Classification Search
CPC ..... G10L 19/02; G10L 19/0204; G10L 21/02; G10L 21/0316; G10L 21/0332;
(Continued)

(56) References Cited

U.S. PATENT DOCUMENTS 5,870,704 A * 2/1999 Laroche ............... G10L 21/04
704/209
7,720,676 B2 * 5/2010 Philippe ............ G10L 19/0208
704/205
(Continued)

FOREIGN PATENT DOCUMENTS

CN 105405448 A 3/2016
CN 106878866 A 6/2017
(Continued)

*Primary Examiner* — Martin Lerner
(74) *Attorney, Agent, or Firm* — HOUTTEMAN LAW LLC

(57) ABSTRACT

The present disclosure provides an audio adjusting method, device and apparatus, and a storage medium. The method includes: acquiring a to-be-adjusted audio signal; acquiring an actual sound effect characteristic curve of the to-be-adjusted audio signal, which is a relation curve of actual values between sound effect parameters including level values characterizing frequency response characteristics of the audio signal, and frequency points, of the to-be-adjusted audio signal; determining, according to at least the actual sound effect characteristic curve, an abnormal frequency point set in the actual sound effect characteristic curve; acquiring an audio compensation value corresponding to each abnormal frequency point in the abnormal frequency point set, and adjusting the actual sound effect characteristic curve based on at least one audio compensation value to obtain an adjusted sound effect characteristic curve; and outputting an adjusted audio signal based on the adjusted sound effect characteristic curve.

10 Claims, 3 Drawing Sheets

(51) Int. Cl.
*G10L 25/03* (2013.01)
*G10L 25/51* (2013.01)
*G10L 25/81* (2013.01)
*G10L 25/87* (2013.01)

(58) Field of Classification Search
CPC . G10L 21/034; G10L 25/81; G10H 2110/036; G10H 2110/046
USPC .......... 704/205, 206, 226, 227; 84/626, 662
See application file for complete search history.

(56) References Cited

U.S. PATENT DOCUMENTS

| | | | |
|---|---|---|---|
| 9,613,640 B1* | 4/2017 | Balamurali | G10L 25/81 |
| 10,466,959 B1* | 11/2019 | Yang | G10L 25/51 |
| 2003/0101050 A1* | 5/2003 | Khalil | G10L 25/81 |
| 2005/0119879 A1* | 6/2005 | Sung | G10L 21/02 |
| | | | 704/205 |
| 2008/0189100 A1* | 8/2008 | LeBlanc | G10L 19/005 |
| | | | 704/207 |
| 2011/0093260 A1* | 4/2011 | Liu | G10L 25/81 |
| | | | 704/201 |
| 2011/0264454 A1* | 10/2011 | Ullberg | G10L 19/0204 |
| | | | 704/500 |
| 2012/0065978 A1* | 3/2012 | Villavicencio | G10L 21/003 |
| | | | 704/258 |
| 2014/0058726 A1* | 2/2014 | Konchitsky | G10L 25/81 |
| | | | 704/233 |
| 2015/0332667 A1* | 11/2015 | Mason | G10L 25/81 |
| | | | 704/249 |
| 2015/0348562 A1 | 12/2015 | Krishnaswamy et al. | |
| 2018/0025732 A1* | 1/2018 | Lepauloux | G10L 25/81 |
| | | | 704/210 |
| 2020/0045423 A1* | 2/2020 | Fong | G10L 21/0232 |
| 2020/0286499 A1* | 9/2020 | Duong | G10L 21/003 |

FOREIGN PATENT DOCUMENTS

| | | | | |
|---|---|---|---|---|
| CN | 109119088 A | 1/2019 | | |
| CN | 208353527 U | 1/2019 | | |
| CN | 109658942 A | 4/2019 | | |
| CN | 110191396 A | 8/2019 | | |
| CN | 110913325 A | 3/2020 | | |
| CN | 113076075 A | 7/2021 | | |
| EP | 3761672 A1 * | 1/2021 | ......... | G10L 19/008 |
| WO | WO-2014160548 A1 * | 10/2014 | ............... | G10H 1/12 |
| WO | WO 2021038514 A1 | 3/2021 | | |

* cited by examiner

AUDIO COMPENSATION WITH SOUND EFFECT CHARACTERISTIC CURVE TO ADJUST ABNORMAL FREQUENCY POINTS

CROSS-REFERENCE TO RELATED APPLICATION

This is a National Phase Application filed under 35 U.S.C. 371 as a national stage of PCT/CN2021/119641, filed on Sep. 22, 2021, the contents of which are incorporated herein in their entirety by reference.

TECHNICAL FIELD

The present disclosure relates to the field of control, and specifically relates to an audio adjusting method, device and apparatus, and a storage medium.

BACKGROUND

A high-end display terminal needs to demonstrate quality in sound effect, in addition to the outstanding advantage of high resolution in display effect. However, due to the limitation of a product size, the display terminal typically has an audio device of a limited volume, resulting in incomplete sound effect, and poor performance of some music.

During the use, if the sound effect can be optimized through a compensation means of the display terminal itself, better user experience can be obtained.

SUMMARY

Embodiments of the present disclosure provide an audio adjusting method, an audio adjusting device, an audio adjusting apparatus, and a computer-readable storage medium, which are configured to adjust an audio signal and improve a sound effect output effect.

In order to achieve the above objects, the present disclosure provides an audio adjusting method, including:
acquiring an audio signal to be adjusted:
acquiring an actual sound effect characteristic curve of the audio signal to be adjusted, where the actual sound effect characteristic curve is a relation curve between actual values of sound effect parameters and frequency points of the audio signal to be adjusted, and the sound effect parameters include level values characterizing frequency response characteristics of the audio signal;
determining, according to at least the actual sound effect characteristic curve, a set of abnormal frequency points in the actual sound effect characteristic curve;
acquiring an audio compensation value corresponding to each abnormal frequency point in the set of abnormal frequency points, and adjusting the actual sound effect characteristic curve based on at least one audio compensation value to obtain an adjusted sound effect characteristic curve; and
outputting an adjusted audio signal based on the adjusted sound effect characteristic curve.

In an embodiment, the method further includes:
acquiring an audio attribute of the audio signal to be adjusted, and determining, according to the audio attribute, an audio type of the audio signal to be adjusted; and
acquiring a target sound effect characteristic curve corresponding to a target audio type, where the target sound effect characteristic curve is a relation curve between target values of the sound effect parameters and frequency points;
the determining, according to at least the actual sound effect characteristic curve, the set of abnormal frequency points in the actual sound effect characteristic curve includes:
performing, for each frequency point corresponding to the actual sound effect characteristic curve, steps of:
determining, according to the target sound effect characteristic curve and the actual sound effect characteristic curve, a difference between an actual value and a target value of a sound effect parameter corresponding to the frequency point; and
determining, in a case that the difference between the actual value and the target value of the sound effect parameter corresponding to the frequency point is greater than a preset difference threshold, the frequency point as an abnormal frequency point in the set of abnormal frequency points.

In an embodiment, acquiring the audio compensation value corresponding to each abnormal frequency point in the set of abnormal frequency points, and adjusting the actual sound effect characteristic curve based on at least one audio compensation value to obtain the adjusted sound effect characteristic curve includes:
performing, based on a preset reference audio compensation value, sound effect parameter compensation on each abnormal frequency point in the set of abnormal frequency points, to obtain an updated value of the sound effect parameter corresponding to each abnormal frequency point;
calculating, for each abnormal frequency point that is compensated, a first difference between the updated value and the target value of the sound effect parameter;
updating, in a case that the first difference is not greater than the preset difference threshold, the actual value of the sound effect parameter with the updated value, and removing the abnormal frequency point from the set of abnormal frequency points;
updating the set of abnormal frequency points according to the remaining abnormal frequency points; and
returning to the step of performing, based on the preset reference audio compensation value, sound effect parameter compensation on each abnormal frequency point in the set of abnormal frequency points, until the first difference between the updated value and the target value of the sound effect parameter at each frequency point in the set of abnormal frequency points is within the preset difference threshold.

In an embodiment, the determining, according to the audio attribute, the audio type of the audio signal to be adjusted includes:
determining, according to the audio attribute, a voice time length in the audio signal to be adjusted;
determining a difference between a playing time length of the audio signal to be adjusted and the voice time length as a music time length;
determining, according to a relation among a first ratio, a second ratio and a first preset ratio, the audio type of the audio signal to be a first type or a second type: where the first ratio is a ratio of the voice time length to the playing time length, and the second ratio is a ratio of the music time length to the playing time length.

In an embodiment, the first type includes at least a first subtype, a second subtype, and a third subtype, and after determining, according to the relation among the first ratio, the second ratio and the first preset ratio, the audio type of the audio signal to be the first type or the second type, the method further includes:

respectively determining, in a case that the audio type of the audio signal is determined as the first type, a third ratio of high frequency signals, a fourth ratio of intermediate frequency signals, and a fifth ratio of low frequency signals in the audio signal; and determining, according to a relation among the third ratio, the fourth ratio, the fifth ratio and a second preset ratio, the audio type to be one of the first subtype, the second subtype, and the third subtype.

In an embodiment, the determining, according to at least the actual sound effect characteristic curve, the set of abnormal frequency points in the actual sound effect characteristic curve includes:

judging whether an abnormal wave band is present in the actual sound effect characteristic curve, where the abnormal wave band includes a peak or a valley; and determining, in a case that the abnormal wave band is present, each frequency point corresponding to the abnormal wave band as an abnormal frequency point.

In an embodiment, the method further includes: storing the adjusted sound effect characteristic curve.

The present disclosure further provides an audio adjusting device, which includes:

a first acquisition device configured to acquire an audio signal to be adjusted;

a second acquisition device configured to acquire an actual sound effect characteristic curve of the audio signal to be adjusted, where the actual sound effect characteristic curve is a relation curve between actual values of sound effect parameters and frequency points of the audio signal to be adjusted, and the sound effect parameters include level values characterizing frequency response characteristics of the audio signal;

a determining device configured to determine, according to at least the actual sound effect characteristic curve, a set of abnormal frequency points in the actual sound effect characteristic curve;

an adjusting device configured to acquire an audio compensation value corresponding to each abnormal frequency point in the set of abnormal frequency points, and adjust the actual sound effect characteristic curve based on at least one audio compensation value to obtain an adjusted sound effect characteristic curve; and an output device configured to output an adjusted audio signal based on the adjusted sound effect characteristic curve.

The present disclosure further provides an audio adjusting apparatus, which includes: a processor, and a memory storing computer program instructions thereon; and the processor reads and executes the computer program instructions to implement the audio adjusting method according to the embodiments of the present disclosure.

The present disclosure further provides a computer-readable storage medium, which has computer program instructions stored thereon which, when executed by a processor, cause the audio adjusting method according to the embodiments of the present disclosure to be implemented.

BRIEF DESCRIPTION OF DRAWINGS

Accompanying drawings are provided for a further understanding of this disclosure and constitute a part of the specification. Hereinafter, these drawings are intended to explain the present disclosure together with the following specific implementations, but should not be considered as a limitation to the present disclosure. In the drawings.

DETAIL DESCRIPTION OF EMBODIMENTS

Figure 1:
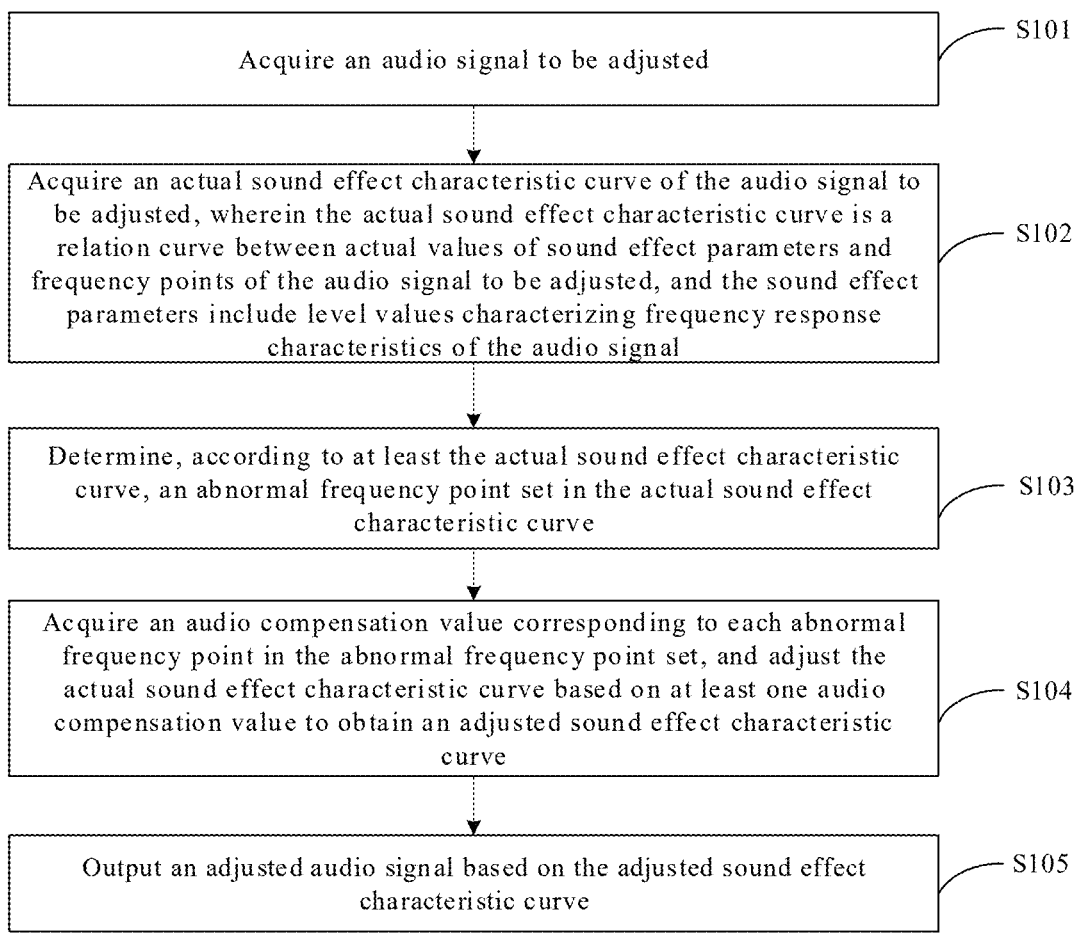
FIG. 1 is a schematic flowchart of an audio adjusting method according to an embodiment of the present disclosure.

Hereinafter, specific implementations of the present disclosure will be described in conjunction with the accompanying drawings. It will be appreciated that the specific implementations as set forth herein are merely for the purpose of illustration and explanation of the present disclosure and should not be constructed as a limitation thereof.

Unless otherwise defined, technical or scientific terms used in the embodiments of the present disclosure are intended to have general meanings as understood by those of ordinary skill in the art. The words "first", "second" and the like used in the present disclosure do not denote any order, quantity, or importance, but are used merely for distinguishing different components from each other. Similarly, the word "comprise", "include" or the like means that the element or item preceding the word includes elements or items that appear after the word or equivalents thereof, but does not exclude other elements or items. The terms "connected", "coupled" and the like are not restricted to physical or mechanical connections, but may include electrical connections, whether direct or indirect. The words "upper", "lower", "left", "right", and the like are merely used to indicate a relative positional relationship, and when an absolute position of the described object is changed, the relative positional relationship may also be changed accordingly.

Due to its audio device of a limited volume, the high-end display terminal has the defects of incomplete sound effect, and poor performance of some music. If the sound effect can be optimized through sound effect compensation, better user experience of the high-end display terminal can be obtained.

In the related art, a user usually adjusts the sound effect parameters by himself/herself to implement sound effect compensation. However, this manual adjusting method cannot adjust the sound effect to the best mode rapidly, and needs repeated adjustment to output more perfect sound effect. Meanwhile, flaws of the terminal audio device are likely to be exposed when the sound effect parameters are adjusted manually.

In view of the above problems, an embodiment of the present disclosure provides an audio adjusting method including the following steps S101 to S105.

At step S101, an audio signal to be adjusted is acquired.

In some embodiments, the audio signal may be acquired by a multi-channel audio acquisition device, and an acquisition time length may be preset before the acquisition; or pieces of audio signal may be collected at a preset time interval, where the collected audio signal includes audio signals that are in spaced preset time periods, which is not limited in the present disclosure.

At step S102, an actual sound effect characteristic curve of the audio signal to be adjusted is acquired. The actual sound effect characteristic curve is a relation curve between actual values of sound effect parameters and frequency points of the audio signal to be adjusted, and the sound effect parameters include level values characterizing frequency response characteristics of the audio signal.

It should be noted that in general, the sound effect characteristic curve may be a frequency response curve. In an example, during collection of the audio signal, the frequency of the output signal of the signal generator is continuously changed, while the amplitude thereof remains unchanged. The output level corresponding to the continuous change from the amplifier is recorded at the output terminal through an oscilloscope, and then a curve of frequencies vs. levels can be drawn in a coordinate system, where an abscissa of the curve is frequency (Hz or KHz), and an ordinate of the curve is level (dB).

At step S103, according to at least the actual sound effect characteristic curve, an abnormal frequency point set in the actual sound effect characteristic curve is determined.

The abnormal frequency point set may include one or more abnormal frequency points. An abnormal frequency point refers to: a frequency point having a sound effect parameter greatly different from that of other frequency points. For example, on an actual sound effect characteristic curve, if a significant peak appears at a position, the frequency point corresponding to that position is an abnormal frequency point. The specific method for determining the abnormal frequency point set will be described in detail in the following embodiments, and thus will not be repeated here.

At step S104, an audio compensation value corresponding to each abnormal frequency point in the abnormal frequency point set is acquired, and the actual sound effect characteristic curve is adjusted based on at least one audio compensation value to obtain an adjusted sound effect characteristic curve.

At step S105, an adjusted audio signal is output based on the adjusted sound effect characteristic curve.

In the audio adjusting method according to the embodiments of the present disclosure, firstly an audio signal to be adjusted, as well as an actual sound effect characteristic curve thereof, is acquired, and then based at least on the curve, an abnormal frequency point set is determined, and finally, based on an audio compensation value, each abnormal frequency point in the abnormal frequency point set is adjusted to obtain an adjusted sound effect characteristic curve. According to the above audio adjusting method, for a scenario where the display terminal outputs a poor sound effect, the step of manually modifying the audio parameters is omitted, the efficiency in parameter adjustment is increased, and the audio output quality is improved.

Optionally, the audio adjusting method according to the embodiment of the present disclosure further includes:

acquiring an audio attribute of the audio signal to be adjusted, and determining, according to the audio attribute, an audio type of the audio signal to be adjusted; and acquiring a target sound effect characteristic curve corresponding to a target audio type. The target sound effect characteristic curve is a relation curve between target values of the sound effect parameters and frequency points.

In step S103, determining, according to at least the actual sound effect characteristic curve, the abnormal frequency point set in the actual sound effect characteristic curve includes: performing, for each frequency point corresponding to the actual sound effect characteristic curve, the following steps A1 and A2.

At step A1, according to the target sound effect characteristic curve and the actual sound effect characteristic curve, a difference between an actual value and a target value of a sound effect parameter corresponding to the frequency point is determined.

At step A2, when the difference between the actual value and the target value of the sound effect parameter corresponding to the frequency point is greater than a preset difference threshold, the frequency point is determined as an abnormal frequency point in the abnormal frequency point set.

In some embodiments, the target sound effect characteristic curve is determined according to optimal sound effect parameters generated in advance based on a laboratory environment, and the optimal sound effect parameters are parameters used in the optimal playing state. Meanwhile, each audio type has its corresponding target sound effect characteristic curve. The target sound effect characteristic curves corresponding to respective audio types may be stored in a cache module in advance.

It should be noted that the preset difference threshold may be set to 3 dB, or may be set to other value by those skilled in the art according to empirical values, which is not limited in the present disclosure.

In an example, by taking the target sound effect characteristic curve as a reference, frequency points, having a difference greater than [−3 dB, +3 dB] from the target sound effect characteristic curve, in the actual sound effect characteristic curve are taken as abnormal frequency points, and are recorded to generate an abnormal frequency point set.

In step S104, acquiring the audio compensation value corresponding to each abnormal frequency point in the abnormal frequency point set, and adjusting the actual sound effect characteristic curve based on at least one audio compensation value to obtain the adjusted sound effect characteristic curve include the following steps B1 to B5.

At step B1, based on a preset reference audio compensation value, sound effect parameter compensation is performed on each abnormal frequency point in the abnormal frequency point set, to obtain an updated value of the sound effect parameter corresponding to each abnormal frequency point.

At step B2, for each abnormal frequency point that is compensated, a first difference between the updated value and the target value of the sound effect parameter is calculated.

At step B3, when the first difference is not greater than the preset difference threshold, the actual value of the sound effect parameter is updated with the updated value, and the abnormal frequency point is removed from the abnormal frequency point set.

At step B4, the abnormal frequency point set is updated according to the remaining abnormal frequency points.

At step B5, return to the step of performing, based on the preset reference audio compensation value, sound effect parameter compensation on each abnormal frequency point in the abnormal frequency point set, until the first difference between the updated value and the target value of the sound effect parameter at each frequency point in the abnormal frequency point set is not greater than the preset difference threshold.

During the sound effect parameter compensation of the abnormal frequency points in the actual sound effect characteristic curve, since the differences between actual values and target values of a plurality of abnormal frequency points are not always the same, a step compensation unit is preset to perform, based on the reference audio compensation value, sound effect parameter compensation on each abnormal frequency point in the abnormal frequency point set, and the sound effect parameter at that frequency point is modified, so that the compensation of the abnormal frequency point with a smaller difference is completed firstly, and the sound effect parameter compensation of all the frequency points in the abnormal frequency point set is gradually completed after multiple times of circulated compensation.

It should be noted that the reference audio compensation value may be a minimum step compensation unit preset by a person skilled in the art according to empirical values, such as 0.1 dB, or may be other empirical values, which is not limited in the embodiments of the present disclosure.

In the audio adjusting method according to the embodiments of the present disclosure, the sound effect parameter compensation on all abnormal frequency points is gradually completed on the basis of the step compensation unit, so that the phenomena of popping, distortion and the like during audio playing of the terminal can be effectively eliminated. In case of poor performance of the audio device, the sound effect can be revised in time, and better sound effect experience can be provided for the user.

In some embodiments, determining, according to the audio attribute, the audio type of the audio signal to be adjusted includes:

determining, according to the audio attribute, a voice time length in the audio signal to be adjusted: determining a difference between a playing time length of the audio signal to be adjusted and the voice time length of the audio signal to be adjusted as a music time length: and determining, according to a relation among a first ratio, a second ratio and a first preset ratio, the audio type of the audio signal to be a first type or a second type. The first ratio is a ratio of the voice time length to the playing time length, and the second ratio is a ratio of the music time length to the playing time length.

The audio attribute may be a frequency distribution, an amplitude variation, or the like.

In an example, a voice time length T1 in the audio signal to be adjusted is determined according to the audio attribute, and a difference between a playing time length T0 of the audio signal to be adjusted and the voice time length T1 of the audio signal to be adjusted is determined as a music time length T2. A ratio of the voice time length to the playing time length is calculated, that is, the first ratio K1=T1/T0, a ratio of the music time length to the playing time length is calculated, that is, the second ratio K2=T2/T0, and a first preset ratio K0 is set.

As shown in TABLE 1 below; in the case that the ratio of the voice time length and the ratio of the music time length are both greater than the first preset ratio, that is, K1>K0 and K2>K0, if the voice time length T1< the music time length T2 (or the ratio of the voice time length K1< the ratio of the music time length K2), which indicates that the audio being currently played mainly contains music, the audio type of the audio signal is determined to be a first type, such as music (pop, classical, dance music, or the like); and if the voice time length T1> the music time length T2 (or the ratio of the voice time length K1> the ratio of the music time length K2), which indicates the audio being currently played mainly contains voice, the audio type of the audio signal is determined to be a second type, such as movie, speech, performance, or the like.

When the ratio of the voice time length is greater than the first preset ratio, i.e., K1>K0, and the ratio of the music time length is less than the first preset ratio, i.e., K2<K0, the audio type of the audio signal is determined to be the second type, such as movie (speech, performance, or the like).

When the ratio of the music time length is greater than the first preset ratio, i.e., K2>K0, and the ratio of the voice time length is less than the first preset ratio, i.e., K1<K0, the audio type of the audio signal is determined to be the first type, such as music (pop, classical, dance music, or the like).

When the ratio of the music time length is smaller than the first preset ratio, i.e., K2<K0, and the ratio of the voice time length is smaller than the first preset ratio, i.e., K1<K0, the current audio is considered to be invalid.

TABLE 1

Audio type determination rules

| Voice ratio | Music ratio | Voice/Music | Result |
|---|---|---|---|
| $K_1 > K_0$ | $K_2 > K_0$ | $K_1 > K_2$ | Voice |
| $K_1 > K_0$ | $K_2 > K_0$ | $K_1 < K_2$ | Music |
| $K_1 > K_0$ | $K_2 < K_0$ | / | Voice |
| $K_1 < K_0$ | $K_2 > K_0$ | / | Music |
| $K_1 < K_0$ | $K_2 < K_0$ | / | Invalid |

In some embodiments, the first type includes at least a first subtype, a second subtype, and a third subtype. After determining, according to the relation among the first ratio, the second ratio and the first preset ratio, the audio type of the audio signal to be the first type or the second type, the method further includes:

respectively determining, in a case that the type of the audio signal is determined to be the first type, a third ratio of high frequency signals, a fourth ratio of intermediate frequency signals, and a fifth ratio of low frequency signals in the audio signal; and determining, according to a relation among the third ratio, the fourth ratio, the fifth ratio and a second preset ratio, the audio type to be one of the first subtype, the second subtype, and the third subtype.

In an embodiment, in a case that the audio type is determined to be the first type, the audio type of the audio signal to be adjusted needs to be further classified by calculating a main frequency band of the audio.

In an example, a high frequency signal distribution ratio f1, an intermediate frequency signal distribution ratio f2, and a low frequency signal distribution ratio f3 are calculated, and a second preset ratio f0 is set in advance.

As shown in TABLE 2, if all of the high, intermediate and low frequency signals are rich and the frequency bands are relatively even, i.e., 30%<f1<40%, 30%<f2<40%, and 30%<f3<40%, the audio signal to be adjusted is determined to be pop music.

If the intermediate frequency signal distribution ratio is greater than the second preset ratio, i.e., f2>f0, and there are fewer high and low frequency signals, i.e., f2>(f0+f1), which indicates that the frequency spectrum is mainly concentrated in the intermediate frequency band, the audio signal to be adjusted is determined to be classical music.

If there are more low and high frequency signals, i.e., f1>40%, and f3>40%, the audio signal to be adjusted is determined to be dance music.

TABLE 2

Music subtype determination rules

| Low frequency ratio | Intermediate frequency ratio | High frequency ratio | Music type |
|---|---|---|---|
| 30% < f1 < 40% | 30% < f2 < 40% f2 > f0; f2 > (f0 + f1) | 30% < f3 < 40% | Pop Classical |
| f1 > 40% | | f2 > 40% | Dance |

In the process of determining the audio type of the audio signal to be adjusted, the first preset ratio, the second preset ratio, and the determination rules are all set by those skilled in the art according to empirical parameters, which are not limited in the present disclosure.

In the above embodiment, the abnormal frequency point set is determined by comparing the actual sound effect characteristic curve with the target sound effect characteristic curve. In other embodiments, other methods may be adopted to determine the abnormal frequency point set. For example, in some embodiments, determining, according to at least the actual sound effect characteristic curve, the abnormal frequency point set in the actual sound effect characteristic curve includes:

judging whether an abnormal wave band is present in the actual sound effect characteristic curve, where the abnormal wave band includes a peak or a valley; and determining, when the abnormal wave band is present, each frequency point corresponding to the abnormal wave band as an abnormal frequency point.

In an example, a difference in average actual values of the sound effect parameters between every two adjacent first frequency bands in the actual sound effect characteristic curve is detected, where the first frequency band includes a preset number of frequency points: and in a case that the difference in average actual values of the sound effect parameters is greater than the preset difference, each frequency point in a later frequency band of the adjacent first frequency bands is determined as at least one frequency point in the abnormal frequency point set.

For example, every three frequency points are set as a frequency band, and an average actual value of the sound effect parameters of the frequency points in each frequency band is determined. A difference in the average actual values between adjacent frequency bands is detected, and in the case that the difference is greater than the preset difference, the three frequency points in the later frequency band are determined as abnormal frequency points.

In some embodiments, the audio adjusting method according to the embodiment of the present disclosure further includes: storing the adjusted sound effect characteristic curve.

In the audio adjusting method according to the embodiments of the present disclosure, after the sound effect characteristic curve to be adjusted is adjusted, the adjusted sound effect characteristic curve may be stored at a preset storage address so that the corresponding audio parameter can be directly retrieved for next use.

It should be noted that the preset storage address for storing the adjusted sound effect characteristic curve and the storage address for a target sound effect characteristic curve of a different audio type may be the same or different, which is not limited in the present disclosure.

The audio adjusting method of the present disclosure will be described in detail below in specific embodiments with reference to the accompanying drawings.

Figure 2:
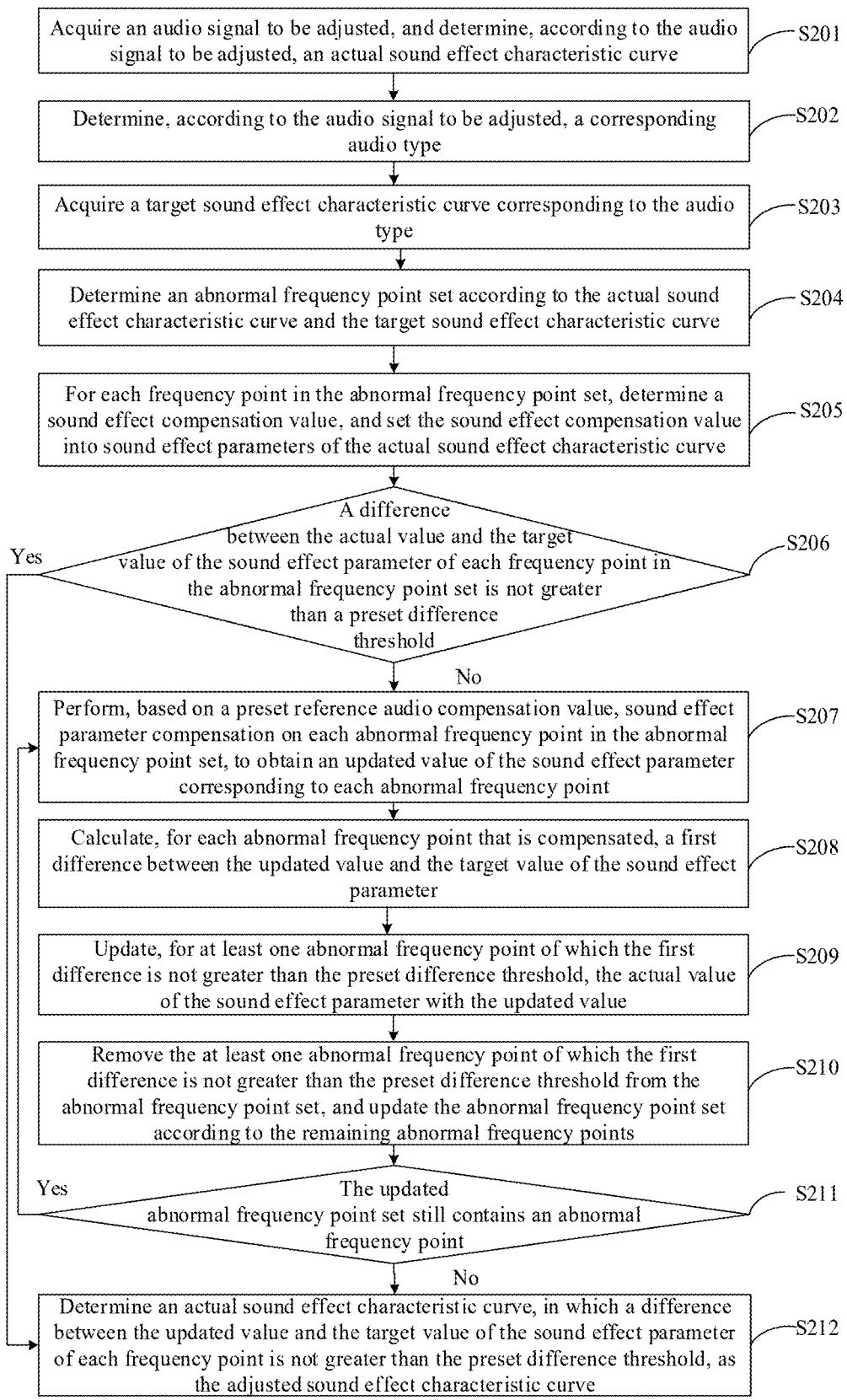
FIG. 2 is a schematic flowchart of another audio adjusting method according to an embodiment of the present disclosure.

As shown in FIG. 2, at step S201, an audio signal to be adjusted is acquired, and according to the audio signal to be adjusted, an actual sound effect characteristic curve is determined.

At step S202, according to the audio signal to be adjusted, a corresponding audio type is determined.

In some embodiments, determining, according to the audio attribute, the audio type of the audio signal to be adjusted includes the following steps C1 to C3.

At step C1, according to the audio attribute, a voice time length in the audio signal to be adjusted is determined.

At step C2, a difference between a playing time length and the voice time length of the audio signal to be adjusted is determined as a music time length.

At step C3, according to a relation among a first ratio, a second ratio and a first preset ratio, the audio type of the audio signal is determined to be a first type or a second type. The first ratio is a ratio of the voice time length to the playing time length, and the second ratio is a ratio of the music time length to the playing time length.

The audio attribute may be a frequency distribution, an amplitude variation, or the like.

In an example, a voice time length T1 in the audio signal to be adjusted is determined according to the audio attribute, and a difference between a playing time length T0 of the audio signal to be adjusted and the voice time length T1 of the audio signal to be adjusted is determined as a music time length T2. A ratio of the voice time length to the playing time length is calculated, that is, the first ratio K1=T1/T0, a ratio of the music time length to the playing time length is calculated, that is, the second ratio K2=T2/T0, and a first preset ratio K0 is set.

As shown in TABLE 1 below, in the case that the ratio of the voice time length and the ratio of the music time length are both greater than the first preset ratio, that is, K1>K0 and K2>K0, if the voice time length T1< the music time length T2, which indicates that the audio being currently played mainly contains music, the audio type of the audio signal is determined to be a first type, such as music (pop, classical, dance music, or the like); and if the voice time length T1> the music time length T2, which indicates the audio being currently played mainly contains voice, the audio type of the audio signal is determined to be the second type, such as movie (speech, performance, or the like).

When the ratio of the voice time length is greater than the first preset ratio, i.e., K1>K0, and the ratio of the music time length is smaller than the first preset ratio, i.e., K2<K0, the audio type of the audio signal is determined to be the second type, such as movie (speech, performance, or the like).

When the ratio of the music time length is greater than the first preset ratio, i.e., K2>K0, and the ratio of the voice time length is smaller than the first preset ratio, i.e., K1<K0, the audio type of the audio signal is determined to be the first type, such as music (pop, classical, dance music, or the like).

When the ratio of the music time length is smaller than the first preset ratio, i.e., K2<K0, and the ratio of the voice time length is smaller than the first preset ratio, i.e., K1<K0, the current audio is considered to be invalid.

TABLE 1

Audio type determination rules

| Voice ratio | Music ratio | Voice/Music | Result |
|---|---|---|---|
| $K_1 > K_0$ | $K_2 > K_0$ | $K_1 > K_2$ | Voice |
| $K_1 > K_0$ | $K_2 > K_0$ | $K_1 < K_2$ | Music |

TABLE 1-continued

Audio type determination rules

| Voice ratio | Music ratio | Voice/Music | Result |
|---|---|---|---|
| $K_1 > K_0$ | $K_2 < K_0$ | / | Voice |
| $K_1 < K_0$ | $K_2 > K_0$ | / | Music |
| $K_1 < K_0$ | $K_2 < K_0$ | / | Invalid |

In some embodiments, the first type includes at least a first subtype, a second subtype, and a third subtype. After determining, according to the relation among the first ratio, the second ratio and the first preset ratio, the audio type of the audio signal to be the first type or the second type, the method further includes:

respectively determining, in the case that the type of the audio signal is the first type, a third ratio of high frequency signals, a fourth ratio of intermediate frequency signals, and a fifth ratio of low frequency signals in the audio signal: and determining, according to a relation among the third ratio, the fourth ratio, the fifth ratio and a second preset ratio, the audio type to be one of the first subtype, the second subtype, and the third subtype.

In an embodiment, in the case that the audio type is determined to be the first type, the audio type of the audio signal to be adjusted needs to be further classified by calculating a main frequency band of the audio.

In an example, a high frequency signal distribution ratio f1, an intermediate frequency signal distribution ratio f2, and a low frequency signal distribution ratio f3 are calculated, and a second preset ratio f0 is set in advance.

As shown in TABLE 2, if all of the high, intermediate and low frequency signals are rich and the frequency bands are relatively even, i.e., 30%<f1<40%, 30%<f2<40%, and 30%<f3<40%, the audio signal to be adjusted is determined to be pop music. If the intermediate frequency signal distribution ratio is greater than the second preset ratio, i.e., f2>f0, and there are fewer high and low frequency signals, i.e., f2>(f0+f1), which indicates that the frequency spectrum is mainly concentrated in the intermediate frequency band, the audio signal to be adjusted is determined to be classical music. If there are more low and high frequency signals, i.e., f1>40%, and f3>40%, the audio signal to be adjusted is determined to be dance music.

TABLE 2

Music subtype determination rules

| Low frequency ratio | Intermediate frequency ratio | High frequency ratio | Music type |
|---|---|---|---|
| 30% < f1 < 40% | 30% < f2 < 40% | 30% < f3 < 40% | Pop |
| / | f2 > f0; f2 > (f0 + f1) | / | Classical |
| f1 > 40% | | f2 > 40% | Dance |

In the process of determining the audio type of the audio signal to be adjusted, the first preset ratio, the second preset ratio, and the determination rules are all set by those skilled in the art according to empirical parameters, which are not limited in the present disclosure.

At step S203, a target sound effect characteristic curve corresponding to the audio type is acquired.

In some embodiments, the target sound effect characteristic curve is determined according to optimal sound effect parameters generated in advance based on a laboratory environment, and the optimal sound effect parameters are parameters used in the optimal playing state. Meanwhile, each music type has its corresponding target sound effect characteristic curve.

At step S204, an abnormal frequency point set is determined according to the actual sound effect characteristic curve and the target sound effect characteristic curve.

In some embodiments, determining the abnormal frequency point set may include: performing, for each frequency point corresponding to the actual sound effect characteristic curve, the steps of:

determining, according to the target sound effect characteristic curve and the actual sound effect characteristic curve, a difference between an actual value and a target value of a sound effect parameter corresponding to the frequency point: determining, when the difference between the actual value and the target value of the sound effect parameter corresponding to the frequency point is greater than a preset difference threshold, the frequency point as an abnormal frequency point in the abnormal frequency point set.

In some embodiments, determining the abnormal frequency point set may further include:

judging whether an abnormal wave band is present in the actual sound effect characteristic curve, where the abnormal wave band includes a peak or a valley; and determining, when the abnormal wave band is present, each frequency point corresponding to the abnormal wave band as an abnormal frequency point.

In an example, a difference in average actual values of the sound effect parameters between every two adjacent first frequency bands in the actual sound effect characteristic curve is detected, where the first frequency band includes a preset number of frequency points: and in a case that the difference in average actual values of the sound effect parameters is greater than the preset difference, each frequency point in a later frequency band of the adjacent first frequency bands is determined as at least one frequency point in the abnormal frequency point set.

At step S205, a sound effect compensation value is determined for each frequency point in the abnormal frequency point set, and the sound effect compensation value is set into sound effect parameters of the actual sound effect characteristic curve.

In some embodiments, a difference between a level value in the target sound effect characteristic curve and a level value in the actual sound effect characteristic curve at a same frequency point is taken as the sound effect compensation value.

At step S206, it is judged whether the actual sound effect characteristic curve has been adjusted to meet a preset requirement, i.e., whether a difference between the actual value and the target value of the sound effect parameter of each frequency point in the abnormal frequency point set is not greater than a preset difference threshold. If the difference is not greater than the preset difference threshold, step S212 is performed: otherwise step S207 is performed.

At step S207, based on a preset reference audio compensation value, sound effect parameter compensation is performed on each abnormal frequency point in the abnormal frequency point set, to obtain an updated value of the sound effect parameter corresponding to each abnormal frequency point.

At step S208, for each abnormal frequency point that is compensated, a first difference between the updated value and the target value of the sound effect parameter is calculated.

At step S209, for at least one abnormal frequency point of which the first difference is not greater than the preset difference threshold, the actual value of the sound effect parameter thereof is updated with the updated value.

At step S210, the at least one abnormal frequency point of which the first difference is not greater than the preset difference threshold is removed from the abnormal frequency point set, and the abnormal frequency point set is updated according to the remaining abnormal frequency points.

At step S211, it is judged whether the updated abnormal frequency point set still contains an abnormal frequency point. If the updated abnormal frequency point set still has an abnormal frequency point, return to step S207; otherwise perform step S212.

At step S212, an actual sound effect characteristic curve, in which a difference between the updated value and the target value of the sound effect parameter of each frequency point is not greater than the preset difference threshold, is determined as the adjusted sound effect characteristic curve.

Figure 3:
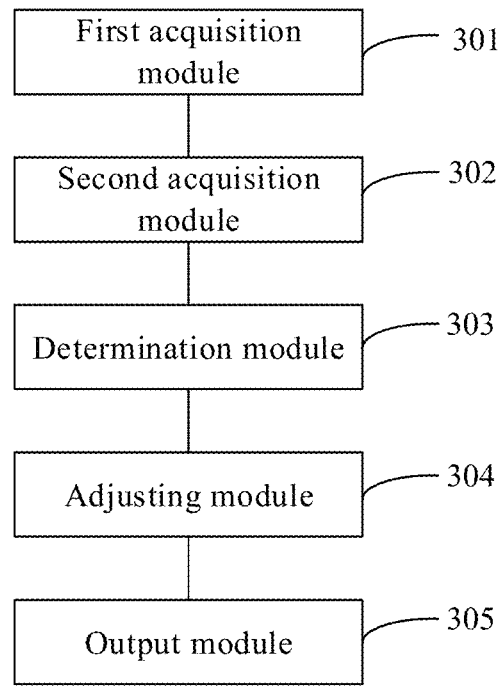
FIG. 3 is a schematic structural diagram of an audio adjusting device according to an embodiment of the present disclosure.

As shown in FIG. 3, an embodiment of the present disclosure further provides an audio adjusting device, including: a first acquisition module 301, a second acquisition module 302, a determination module 303, an adjusting module 304, and an output module 305.

The first acquisition module 301 is configured to acquire an audio signal to be adjusted. The second acquisition module 302 is configured to acquire an actual sound effect characteristic curve of the audio signal to be adjusted. The actual sound effect characteristic curve is a relation curve between actual values of sound effect parameters and frequency points of the audio signal to be adjusted, and the sound effect parameters include level values characterizing frequency response characteristics of the audio signal. The determination module 303 is configured to determine, according to at least the actual sound effect characteristic curve, an abnormal frequency point set in the actual sound effect characteristic curve. The adjusting module 304 is configured to acquire an audio compensation value corresponding to each abnormal frequency point in the abnormal frequency point set, and adjust the actual sound effect characteristic curve based on at least one audio compensation value to obtain an adjusted sound effect characteristic curve. The output module 305 is configured to output the adjusted audio signal based on the adjusted sound effect characteristic curve.

It should be noted that the first acquisition module may include a sound collection unit which may collect sound output from a terminal through a high-sensitivity sound pickup device, such as a multi-channel audio collection device: and the second acquisition module may include a cache unit configured to store a target sound effect characteristic curve obtained based on a laboratory environment. The determination module and the adjusting module may be integrated in a DSP processor, and combined with an SOC chip, determine an actual sound effect currently output from the terminal according to audio data collected by a sound collection module, calculate a sound effect compensation parameter based on the actual sound effect and an ideal sound effect, and transmit the sound effect parameter to a sound output module.

In some embodiments, the audio adjusting device further includes: a third acquisition module and a fourth acquisition module. The third acquisition module is configured to acquire an audio attribute of the audio signal to be adjusted, and determine, according to the audio attribute, an audio type of the audio signal to be adjusted. The fourth acquisition module is configured to acquire a target sound effect characteristic curve corresponding to a target audio type. The target sound effect characteristic curve is a relation curve between target values of the sound effect parameters and frequency points.

In some embodiments, the determination module is specifically configured to: perform, for each frequency point corresponding to the actual sound effect characteristic curve, the steps of:

determining, according to the target sound effect characteristic curve and the actual sound effect characteristic curve, a difference between an actual value and a target value of a sound effect parameter corresponding to the frequency point: determining, when the difference between the actual value and the target value of the sound effect parameter corresponding to the frequency point is greater than a preset difference threshold, the frequency point as an abnormal frequency point in the abnormal frequency point set.

In some embodiments, the adjusting module is specifically configured to: perform, based on a preset reference audio compensation value, sound effect parameter compensation on each abnormal frequency point in the abnormal frequency point set, to obtain an updated value of the sound effect parameter corresponding to each abnormal frequency point: calculate, for each abnormal frequency point that is compensated, a first difference between the updated value and the target value of the sound effect parameter: update, when the first difference is not greater than the preset difference threshold, the actual value of the sound effect parameter with the updated value, and remove the abnormal frequency point from the abnormal frequency point set: update the abnormal frequency point set according to the remaining abnormal frequency points: and return to the operation of performing, based on the preset reference audio compensation value, sound effect parameter compensation on each abnormal frequency point in the abnormal frequency point set, until the first difference between the updated value and the target value of the sound effect parameter at each frequency point in the abnormal frequency point set is not greater than the preset difference threshold.

In some embodiments, the third acquisition module is specifically configured to: determine, according to the audio attribute, a voice time length in the audio signal to be adjusted: determine a difference between a playing time length of the audio signal to be adjusted and the voice time length of the audio signal to be adjusted as a music time length: determine, according to a relation among a first ratio, a second ratio and a first preset ratio, the audio type of the audio signal to be a first type or a second type. The first ratio is a ratio of the voice time length to the playing time length, and the second ratio is a ratio of the music time length to the playing time length.

In some embodiments, the first type includes at least a first subtype, a second subtype, and a third subtype.

The third acquisition module is specifically further configured to:

respectively determine, in a case that the type of the audio signal is determined to be the first type, a third ratio of high frequency signals, a fourth ratio of intermediate frequency signals, and a fifth ratio of low frequency signals in the audio signal: and determine, according to a relation among the third ratio, the fourth ratio, the fifth ratio and a second preset ratio, the audio type to be one of the first subtype, the second subtype, and the third subtype.

In some embodiments, the determination module is specifically configured to:

judge whether an abnormal wave band is present in the actual sound effect characteristic curve, where the abnormal wave band includes a peak or a valley; and determine, when the abnormal wave band is present, each frequency point corresponding to the abnormal wave band as an abnormal frequency point.

In some embodiments, the audio adjusting device further includes: a storage module configured to store the adjusted sound effect characteristic curve.

Figure 4:
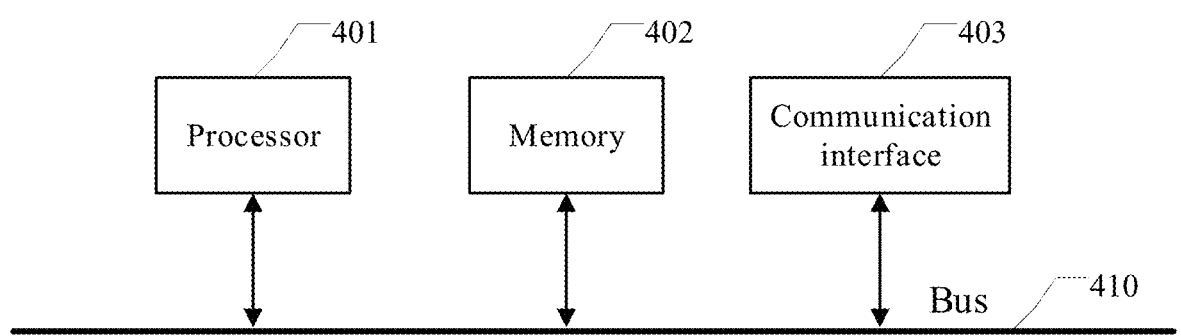
FIG. 4 is a schematic structural diagram of an audio adjusting apparatus according to an embodiment of the present disclosure.

FIG. 4 shows a schematic diagram of a hardware structure of an audio adjusting apparatus according to an embodiment of the present disclosure.

The audio adjusting method and device according to the embodiments of the present disclosure described in conjunction with FIGS. 1 to 3 may be implemented by an audio adjusting apparatus. FIG. 4 is a schematic diagram showing a hardware structure of an audio adjusting apparatus according to an embodiment of the present disclosure.

The audio adjusting apparatus may include a processor 401 and a memory 402 storing computer program instructions thereon.

Specifically, the processor 401 may include a central processing unit (CPU), or an application specific integrated circuit (ASIC), or one or more integrated circuits which may be configured to implement the embodiments of the present disclosure.

The memory 402 may include a mass memory for data or instructions. By way of example but not limitation, the memory 402 may include a hard disk drive (HDD), a floppy disk drive, a flash memory, an optical disk, a magneto-optical disk, a magnetic tape, or a universal serial bus (USB) drive, or a combination of two or more thereof. In an example, the memory 402 may include a removable or non-removable (or fixed) medium, or the memory 402 is a non-volatile solid state memory. The memory 402 may be internal or external to integrated gateway disaster recovery equipment.

In an example, the memory 402 may be a read only memory (ROM). In an example, the ROM may be a mask-programmed ROM, a programmable ROM (PROM), an erasable PROM (EPROM), an electrically erasable PROM (EEPROM), an electrically alterable ROM (EAROM), or a flash memory, or a combination of two or more thereof.

The processor 401 reads and executes the computer program instructions stored in the memory 402 to implement the method/steps S101 to S105 in the embodiment shown in FIG. 1, and achieve the corresponding technical effects that can be achieved by executing the method/steps in the example shown in FIG. 1, which are not repeated here for brevity.

In an example, the audio adjusting apparatus may further include a communication interface 403 and a bus 410. As shown in FIG. 4, the processor 401, the memory 402, and the communication interface 403 are connected via the bus 410 to implement mutual communication.

The communication interface 403 is mainly configured for mutual communication among the modules, devices, units and/or apparatuses in the embodiments of the present disclosure.

The bus 410 includes hardware, software, or both, and is configured to couple components of an online data traffic charging device to one another. By way of example but not limitation, the bus may include an accelerated graphics port (AGP) or other graphics buses, an extended industry standard architecture (EISA) bus, a front side bus (FSB), hyper transport (HT) interconnect, an industry standard architecture (ISA) bus, infiniband interconnect, a low pin count (LPC) bus, a memory bus, a micro channel architecture (MCA) bus, a peripheral component interconnect (PCI) bus, a PCI-Express (PCI-X) bus, a serial advanced technology attachment (SATA) bus, a video electronics standards association local (VLB) bus, or other suitable buses or a combination of two or more thereof. The bus 410 may include one or more buses, where appropriate. Although embodiments of the present disclosure describe and illustrate a particular bus, the present disclosure contemplates any suitable bus or interconnect.

In the audio adjusting apparatus according to the embodiments of the present disclosure, firstly an audio signal to be adjusted, as well as an actual sound effect characteristic curve, is acquired, and then based at least on the curve, an abnormal frequency point set is determined, and finally, based on an audio compensation value, each abnormal frequency point in the abnormal frequency point set is adjusted to obtain an adjusted sound effect characteristic curve. With this audio adjusting apparatus, the method for manually modifying audio parameters is optimized, the efficiency in audio parameter adjustment is increased, the phenomena of popping, distortion and the like during audio playing of the terminal can be effectively eliminated, and the audio output quality is improved.

In addition, in combination with the audio adjusting method in the foregoing embodiments, the embodiments of the present disclosure may be implemented by a computer-readable storage medium. The computer-readable storage medium has computer program instructions stored thereon which, when executed by a processor, cause any of the above audio adjusting methods in the embodiments of the present disclosure to be implemented.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. An audio adjusting method, comprising:
acquiring an audio signal to be adjusted;
acquiring an actual sound effect characteristic curve of the audio signal to be adjusted, wherein the actual sound effect characteristic curve is a relation curve between actual values of sound effect parameters and frequency points of the audio signal to be adjusted, and the sound effect parameters comprise level values characterizing frequency response characteristics of the audio signal;
determining, according to at least the actual sound effect characteristic curve, a set of abnormal frequency points in the actual sound effect characteristic curve;
acquiring an audio compensation value corresponding to each abnormal frequency point in the set of abnormal frequency points, and adjusting the actual sound effect characteristic curve based on at least one audio compensation value to obtain an adjusted sound effect characteristic curve; and
outputting an adjusted audio signal based on the adjusted sound effect characteristic curve,
wherein the method further comprises:

acquiring an audio attribute of the audio signal to be adjusted, and determining, according to the audio attribute, an audio type of the audio signal to be adjusted; and acquiring a target sound effect characteristic curve corresponding to a target audio type, wherein the target sound effect characteristic curve is a relation curve between target values of the sound effect parameters and frequency points;

wherein the determining, according to at least the actual sound effect characteristic curve, the set of abnormal frequency points in the actual sound effect characteristic curve comprises:

performing, for each frequency point corresponding to the actual sound effect characteristic curve, steps of:
  determining, according to the target sound effect characteristic curve and the actual sound effect characteristic curve, a difference between an actual value and a target value of a sound effect parameter corresponding to the frequency point; and
  determining, in a case that the difference between the actual value and the target value of the sound effect parameter corresponding to the frequency point is greater than a preset difference threshold, the frequency point as an abnormal frequency point in the set of abnormal frequency points, wherein the determining, according to the audio attribute, the audio type of the audio signal to be adjusted comprises:

determining, according to the audio attribute, a voice time length in the audio signal to be adjusted;

determining a difference between a playing time length of the audio signal to be adjusted and the voice time length as a music time length;
  determining, according to a relation among a first ratio, a second ratio and a first preset ratio, the audio type of the audio signal to be a first type or a second type; wherein the first ratio is a ratio of the voice time length to the playing time length, and the second ratio is a ratio of the music time length to the playing time length.

2. The method according to claim 1, wherein acquiring the audio compensation value corresponding to each abnormal frequency point in the set of abnormal frequency points, and adjusting the actual sound effect characteristic curve based on at least one audio compensation value to obtain the adjusted sound effect characteristic curve comprises:

performing, based on a preset reference audio compensation value, sound effect parameter compensation on each abnormal frequency point in the set of abnormal frequency points, to obtain an updated value of the sound effect parameter corresponding to each abnormal frequency point;

calculating, for each abnormal frequency point that is compensated, a first difference between the updated value and the target value of the sound effect parameter;

updating, in a case that the first difference is not greater than the preset difference threshold, the actual value of the sound effect parameter with the updated value, and removing the abnormal frequency point from the set of abnormal frequency points;

updating the set of abnormal frequency points according to the remaining abnormal frequency points; and returning to the step of performing, based on the preset reference audio compensation value, sound effect parameter compensation on each abnormal frequency point in the set of abnormal frequency points, until the first difference between the updated value and the target value of the sound effect parameter at each frequency point in the set of abnormal frequency points is not greater than the preset difference threshold.

3. The method according to claim 1, wherein the first type comprises at least a first subtype, a second subtype, and a third subtype, and after determining, according to the relation among the first ratio, the second ratio and the first preset ratio, the audio type of the audio signal to be the first type or the second type, the method further comprises:

respectively determining, in a case that the audio type of the audio signal is determined as the first type, a third ratio of high frequency signals, a fourth ratio of intermediate frequency signals, and a fifth ratio of low frequency signals in the audio signal; and determining, according to a relation among the third ratio, the fourth ratio, the fifth ratio and a second preset ratio, the audio type to be one of the first subtype, the second subtype, and the third subtype.

4. The method according to claim 1, wherein the determining, according to at least the actual sound effect characteristic curve, the set of abnormal frequency points in the actual sound effect characteristic curve comprises:

judging whether an abnormal wave band is present in the actual sound effect characteristic curve, wherein the abnormal wave band comprises a peak or a valley; and determining, in a case that the abnormal wave band is present, each frequency point corresponding to the abnormal wave band as an abnormal frequency point.

5. The method according to claim 1, further comprising: storing the adjusted sound effect characteristic curve.

6. An audio adjusting apparatus, comprising: a processor, and a memory storing computer program instructions thereon, wherein the processor reads and executes the computer program instructions to implement the audio adjusting method of claim 1.

7. A non-transitory computer-readable storage medium, wherein the computer-readable storage medium has computer program instructions stored thereon, which, when executed by a processor, cause the audio adjusting method of claim 1.

8. An audio adjusting device, comprising:
a first acquisition device configured to acquire an audio signal to be adjusted;
a second acquisition device configured to acquire an actual sound effect characteristic curve of the audio signal to be adjusted, wherein the actual sound effect characteristic curve is a relation curve between actual values of sound effect parameters and frequency points of the audio signal to be adjusted, and the sound effect parameters comprise level values characterizing frequency response characteristics of the audio signal;
a determination device configured to determine, according to at least the actual sound effect characteristic curve, a set of abnormal frequency points in the actual sound effect characteristic curve;
an adjusting device configured to acquire an audio compensation value corresponding to each abnormal frequency point in the set of abnormal frequency points, and adjust the actual sound effect characteristic curve based on at least one audio compensation value to obtain an adjusted sound effect characteristic curve;
a third acquisition device configured to acquire an audio attribute of the audio signal to be adjusted, and determine, according to the audio attribute, an audio type of the audio signal to be adjusted; and a fourth acquisition device configured to acquire a target sound effect characteristic curve corresponding to a target audio type, wherein the target sound effect characteristic curve is a relation curve between target values of the sound effect parameters and frequency points;

wherein the determination device is specifically configured to:

perform, for each frequency point corresponding to the actual sound effect characteristic curve, steps of:
  determining, according to the target sound effect characteristic curve and the actual sound effect characteristic curve, a difference between an actual value and a target value of a sound effect parameter corresponding to the frequency point; and
  determining, in a case that the difference between the actual value and the target value of the sound effect parameter corresponding to the frequency point is greater than a preset difference threshold, the frequency point as an abnormal frequency point in the set of abnormal frequency points, wherein the third acquisition device is specifically configured to:

determine, according to the audio attribute, a voice time length in the audio signal to be adjusted;

determine a difference between a playing time length of the audio signal to be adjusted and the voice time length as a music time length;

determine, according to a relation among a first ratio, a second ratio and a first preset ratio, the audio type of the audio signal to be a first type or a second type; wherein the first ratio is a ratio of the voice time length to the playing time length, and the second ratio is a ratio of the music time length to the playing time length.

9. The device according to claim 8, wherein the adjusting device is specifically configured to:

perform, based on a preset reference audio compensation value, sound effect parameter compensation on each abnormal frequency point in the set of abnormal frequency points, to obtain an updated value of the sound effect parameter corresponding to each abnormal frequency point;

calculate, for each abnormal frequency point that is compensated, a first difference between the updated value and the target value of the sound effect parameter;

update, in a case that the first difference is not greater than the preset difference threshold, the actual value of the sound effect parameter with the updated value, and remove the abnormal frequency point from the set of abnormal frequency points;

update the set of abnormal frequency points according to the remaining abnormal frequency points; and return to the operation of performing, based on the preset reference audio compensation value, sound effect parameter compensation on each abnormal frequency point in the set of abnormal frequency points, until the first difference between the updated value and the target value of the sound effect parameter at each frequency point in the set of abnormal frequency points is not greater than the preset difference threshold.

10. The device according to claim 8, wherein the determination device is specifically configured to:

judge whether an abnormal wave band is present in the actual sound effect characteristic curve, wherein the abnormal wave band comprises a peak or a valley; and determine, in a case that the abnormal wave band is present, each frequency point corresponding to the abnormal wave band as an abnormal frequency point.

* * * * *